United States Patent
Huang et al.

(10) Patent No.: US 10,215,791 B2
(45) Date of Patent: Feb. 26, 2019

(54) CAPACITOR DETECTION SYSTEM AND ACTIVE-TYPE PIN-DIVERGING MODULE THEREOF

(71) Applicant: APAQ TECHNOLOGY CO., LTD., Miaoli County (TW)

(72) Inventors: Kuo-Chen Huang, Chiayi County (TW); Ming-Goo Chien, Taichung (TW); Ming-Tsung Liang, New Taipei (TW)

(73) Assignee: APAQ TECHNOLOGY CO., LTD., Miaoli County (TW)

( * ) Notice: Subject to any disclaimer, the term of this patent is extended or adjusted under 35 U.S.C. 154(b) by 196 days.

(21) Appl. No.: 15/360,658

(22) Filed: Nov. 23, 2016

(65) Prior Publication Data
US 2018/0024181 A1    Jan. 25, 2018

(30) Foreign Application Priority Data
Jul. 20, 2016    (TW) .............................. 105122898 A (51) Int. Cl.
| | |
|---|---|
| G01R 27/26 | (2006.01) |
| G01R 31/02 | (2006.01) |
| H01G 13/00 | (2013.01) |
| H01G 9/045 | (2006.01) |

(52) U.S. Cl.
CPC ....... G01R 31/028 (2013.01); G01R 27/2605 (2013.01); H01G 13/00 (2013.01)

(58) Field of Classification Search
CPC ... G01R 31/028; G01R 27/2605; H01G 13/00
USPC .................................. 324/658–690; 361/529
See application file for complete search history.

(56) References Cited

U.S. PATENT DOCUMENTS

2014/0268503 A1*  9/2014  Chen .................... H01G 9/0029
                                                            361/529

\* cited by examiner

*Primary Examiner* — Farhana A Hoque
(74) *Attorney, Agent, or Firm* — Li & Cai Intellectual Property (USA) Office (57) ABSTRACT

A capacitor detection system and an active-type pin-diverging module thereof are disclosed. The active-type pin-diverging module is applied to two conductive pins of a capacitor, and active-type pin-diverging module includes a base structure and a swingable structure. The swingable structure is swingably disposed on the base structure, and the swingable structure includes two swingable elements. The two conductive pins of the capacitor respectively pass through two through holes of a seat board, and each conductive pin has a lateral contact surface. The two swingable elements concurrently slidably contact the two lateral contact surfaces of the two conductive pins of the capacitor so as to diverge the two conductive pins of the capacitor, and the seat board is held by the two diverged conductive pins so as to prevent the seat board from being separated from the capacitor.

10 Claims, 8 Drawing Sheets

CAPACITOR DETECTION SYSTEM AND ACTIVE-TYPE PIN-DIVERGING MODULE THEREOF

BACKGROUND OF THE INVENTION

1. Field of the Invention

The instant disclosure relates to a detection system and a pin-diverging module thereof, and more particularly to a capacitor detection system and an active-type pin-diverging module thereof.

2. Description of Related Art

The winding-type capacitor includes a capacitor core, a casing, and a sealing cover. The capacitor core has an anode foil coupled to an anode terminal, a cathode foil coupled to a cathode terminal, a separator, and an electrolyte layer. The anode foil, the cathode foil and the separator are rolled together. The separator is disposed between the anode foil and the cathode foil. The electrolyte layer is formed between the anode foil and the cathode foil. The casing has an opening for receiving the capacitor core. The sealing cover can be used to seal the casing, and the anode terminal and the cathode terminal can pass through a through hole of the sealing cover. A given space is provided between the sealing cover and the capacitor core. A stopper for securing the space is provided on at least one of the anode terminal and the cathode terminal.

However, the leakage current (LC) of the winding capacitor is increased and a short circuit of the winding capacitor may occur after diverging two pins of the winding capacitor.

SUMMARY OF THE INVENTION

One aspect of the instant disclosure relates to a capacitor detection system and an active-type pin-diverging module thereof.

One of the embodiments of the instant disclosure provides an active-type pin-diverging module applied to two conductive pins of a capacitor, comprising: a base structure and a swingable structure. The swingable structure is swingably disposed on the base structure, and the swingable structure includes two swingable elements. The two conductive pins of the capacitor respectively pass through two through holes of a seat board, each conductive pin has a lateral contact surface, the two swingable elements concurrently slidably contact the two lateral contact surfaces of the two conductive pins of the capacitor so as to diverge the two conductive pins of the capacitor, and the seat board is held by the two diverged conductive pins so as to prevent the seat board from being separated from the capacitor. The friction resistance between the conductive pin and the swingable element is decreased due to the sliding contact between the lateral contact surface of the conductive pin and the swingable element of the swingable structure.

More particularly, the base structure includes a first base body and a second base body detachably connected to the first base body, the first base body has a first base seat and a first pivot seat disposed on the first base seat, the second base body has a second base seat detachably connected to the first base seat and a second pivot seat disposed on the second base seat, and the two swingable elements of the swingable structure are pivotably disposed between the first pivot seat and the second pivot seat.

More particularly, the swingable structure includes two first pivot axles detachably connected to the first pivot seat and two second pivot axles detachably connected to the second pivot seat, one of the two swingable elements is pivotably disposed between one of the two first pivot axles and one of the two second pivot axles, and the other swingable element is pivotably disposed between the other first pivot axle and the other second pivot axle.

More particularly, the active-type pin-diverging module further comprises a driving structure including a fixed seat detachably disposed on the first base seat, a slidable element slidably disposed on the fixed seat, and a driving element disposed on the first base seat for moving the slidable element, and the slidable element has two curved abutting surfaces, wherein each swingable element has an inclined surface and a curved surface opposite to the inclined surface, the two inclined surfaces of the two swingable elements are disposed back to back and respectively slidably contact the two lateral contact surfaces of the two conductive pins of the capacitor, and the two curved surfaces of the two swingable elements are disposed face to face and respectively correspond to the two curved abutting surfaces of the slidable element, wherein the friction resistance between the conductive pin and the swingable element is decreased due to the sliding contact between the lateral contact surface of the conductive pin and the inclined surface of the swingable element.

Another one of the embodiments of the instant disclosure provides a capacitor detection system, comprising a pin-flattening module, an active-type pin-diverging module, a pin-positioning module, and an electrical performance testing module. The pin-flattening module is used for flattening two conductive pins of a capacitor. The active-type pin-diverging module is adjacent to the pin-flattening module, and the active-type pin-diverging module comprises a base structure and a swingable structure. The swingable structure is swingably disposed on the base structure, the swingable structure includes two swingable elements, the two conductive pins of the capacitor respectively pass through two through holes of a seat board, each conductive pin has a lateral contact surface, the two swingable elements concurrently slidably contact the two lateral contact surfaces of the two conductive pins of the capacitor so as to diverge the two conductive pins of the capacitor, and the seat board is held by the two diverged conductive pins so as to prevent the seat board from being separated from the capacitor. The pin-positioning module is adjacent to the active-type pin-diverging module for bending the two conductive pins and positioning the two conductive pins on the seat board. The electrical performance testing module is adjacent to the pin-positioning module for testing the electrical performance of the capacitor.

More particularly, the base structure includes a first base body and a second base body detachably connected to the first base body, the first base body has a first base seat and a first pivot seat disposed on the first base seat, the second base body has a second base seat detachably connected to the first base seat and a second pivot seat disposed on the second base seat, and the two swingable elements of the swingable structure are pivotably disposed between the first pivot seat and the second pivot seat.

More particularly, the swingable structure includes two first pivot axles detachably connected to the first pivot seat and two second pivot axles detachably connected to the second pivot seat, one of the two swingable elements is pivotably disposed between one of the two first pivot axles and one of the two second pivot axles, and the other swingable element is pivotably disposed between the other first pivot axle and the other second pivot axle.

More particularly, the active-type pin-diverging module further comprises a driving structure including a fixed seat detachably disposed on the first base seat, a slidable element slidably disposed on the fixed seat, and a driving element disposed on the first base seat for moving the slidable element, and the slidable element has two curved abutting surfaces, wherein each swingable element has an inclined surface and a curved surface opposite to the inclined surface, the two inclined surfaces of the two swingable elements are disposed back to back and respectively slidably contact the two lateral contact surfaces of the two conductive pins of the capacitor, and the two curved surfaces of the two swingable elements are disposed face to face and respectively correspond to the two curved abutting surfaces of the slidable element, wherein the friction resistance between the conductive pin and the swingable element is decreased due to the sliding contact between the lateral contact surface of the conductive pin and the inclined surface of the swingable element.

More particularly, the capacitor detection system further comprises a heat-generating module disposed between the pin-positioning module and the electrical performance testing module, wherein the heat-generating module provides a predetermined heat source to the capacitor so as to release stresses in the capacitor.

Yet another one of the embodiments of the instant disclosure provides an active-type pin-diverging module, comprising a base structure and a swingable structure. The swingable structure is swingably disposed on the base structure, and the swingable structure includes two swingable elements. The two swingable elements of the swingable structure concurrently slidably contact two conductive pins of a capacitor so as to diverge the two conductive pins of the capacitor, and a seat board is held by the two diverged conductive pins so as to prevent the seat board from being separated from the capacitor.

Therefore, the two swingable elements of the swingable structure can concurrently slidably contact the two lateral contact surfaces of the two conductive pins of the capacitor so as to diverge the two conductive pins of the capacitor, so that the seat board can be held by the two diverged conductive pins so as to prevent the seat board from being separated from the capacitor. Please note that the friction resistance between the conductive pin and the swingable element can be decreased due to the sliding contact between the lateral contact surface of the conductive pin and the swingable element of the swingable structure. More precisely, the friction resistance between the conductive pin and the swingable element is decreased, so that the reaction force applied to the two conductive pins and the capacitor due to the sliding contact between the lateral contact surface and the swingable element can be decreased (or the structural variation of a junction between the conductive pin and the capacitor can be decreased, and an outer force applied to an inner structure of the capacitor can be decreased). Therefore, the capacitor provided by the instant disclosure can avoid increasing leakage current (LC) and causing a short circuit.

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DETAILED DESCRIPTION OF THE PREFERRED EMBODIMENTS

Embodiments of a capacitor detection system and an active-type pin-diverging module thereof according to the instant disclosure are described herein. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

First Embodiment

Figure 5:
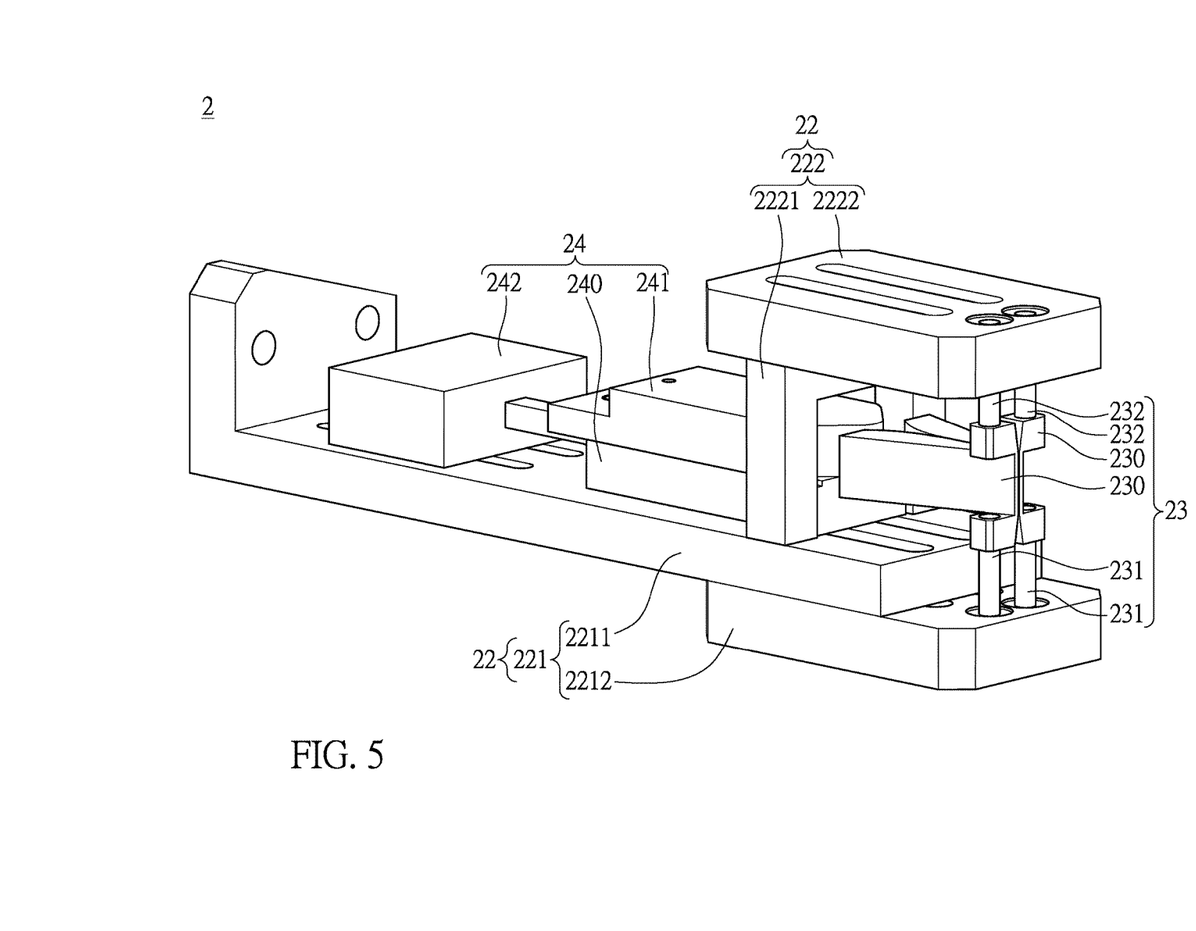
FIG. 5 shows a perspective, assembly, schematic view of the active-type pin-diverging module of the capacitor detection system according to the first embodiment of the instant disclosure.
Figure 6:
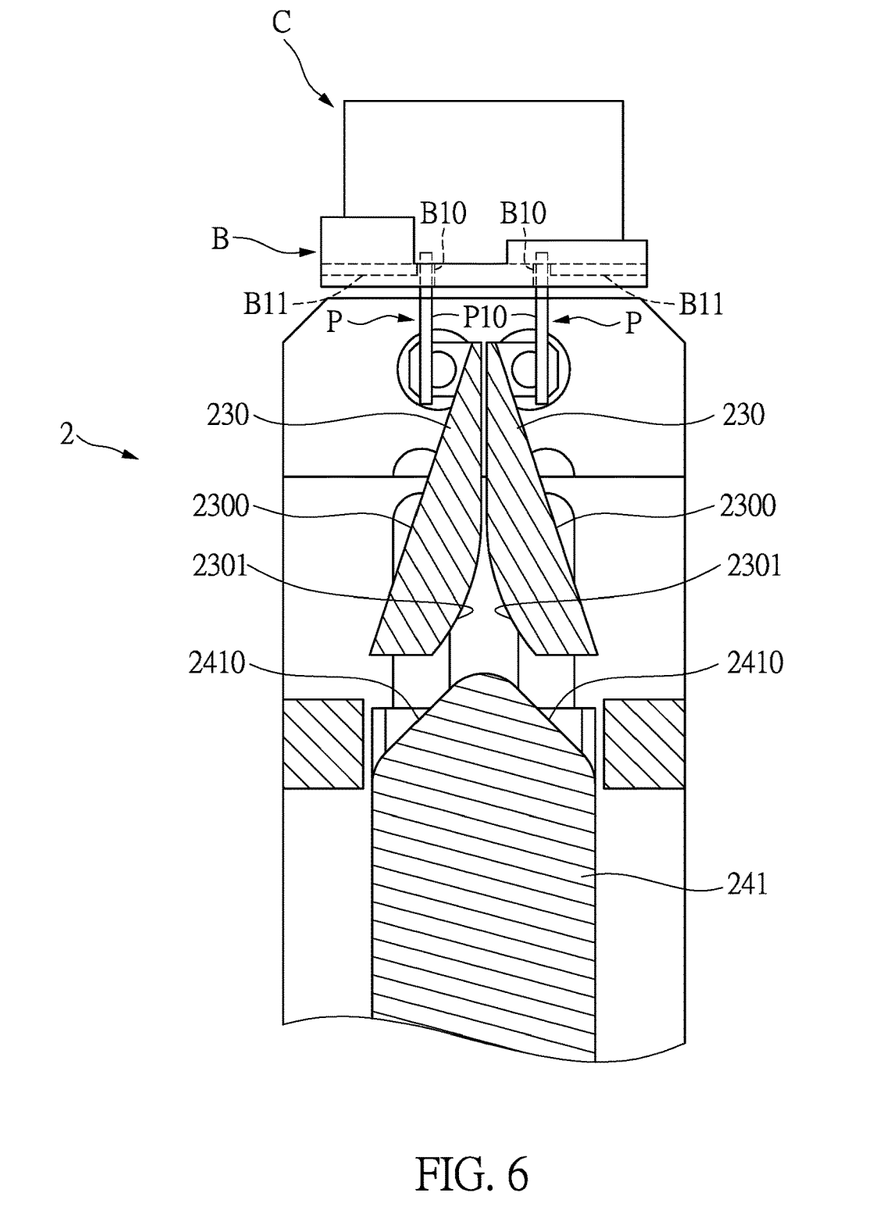
FIG. 6 shows a partial, cross-sectional, schematic view of the two conductive pins of the capacitor before being diverged by the passive-type pin-diverging module according to the first embodiment of the instant disclosure.
Figure 7:
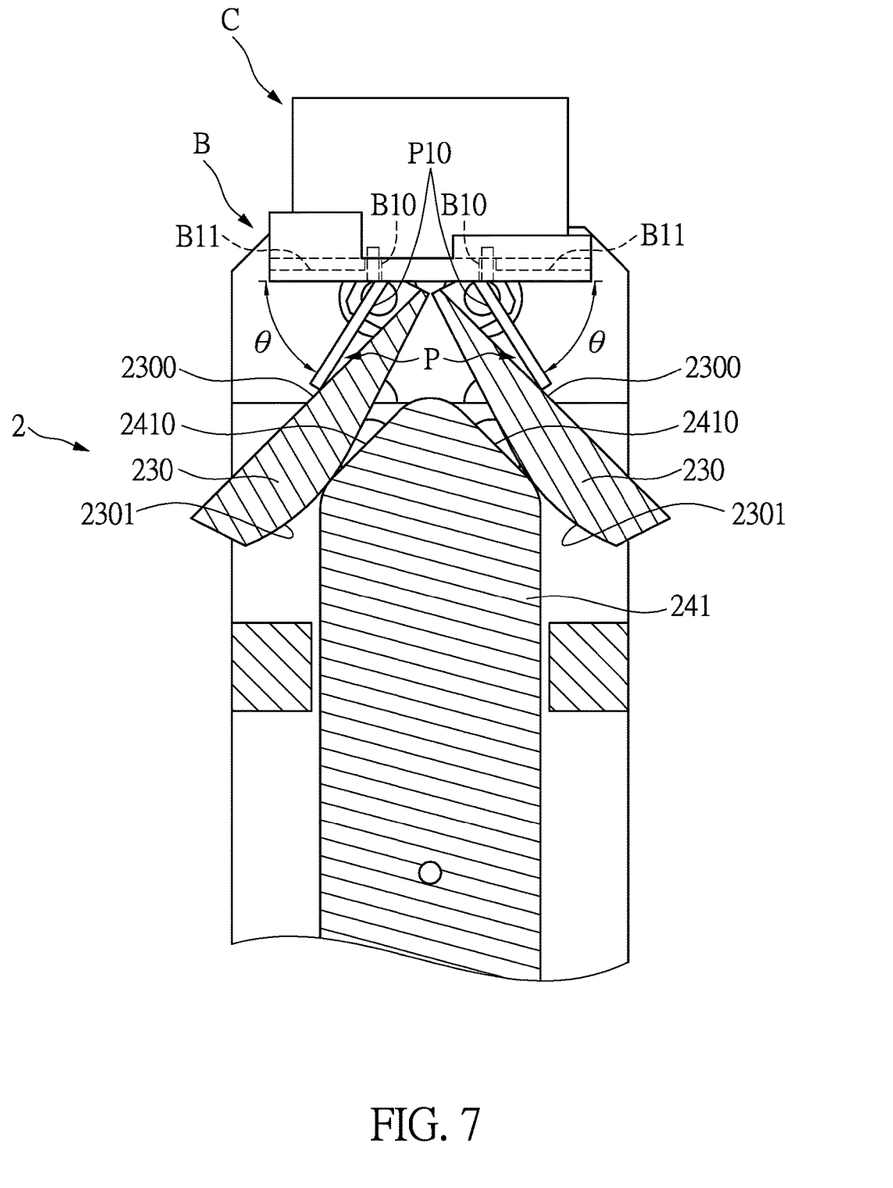
FIG. 7 shows a partial, cross-sectional, schematic view of the two conductive pins of the capacitor after having been diverged by the passive-type pin-diverging module according to the first embodiment of the instant disclosure.

Referring to FIG. 1 to FIG. 8, the first embodiment of the instant disclosure provides a capacitor detection system S, comprising: a pin-flattening module 1, an active-type pin-diverging module 2, a pin-positioning module 3, and an electrical performance testing module 5. The term active-type means that the active-type pin-diverging module 2 can actively contact two conductive pins P of a capacitor C so as to diverge, separate, or split the two conductive pins P of the capacitor C as shown in FIG. 7.

Figure 1:
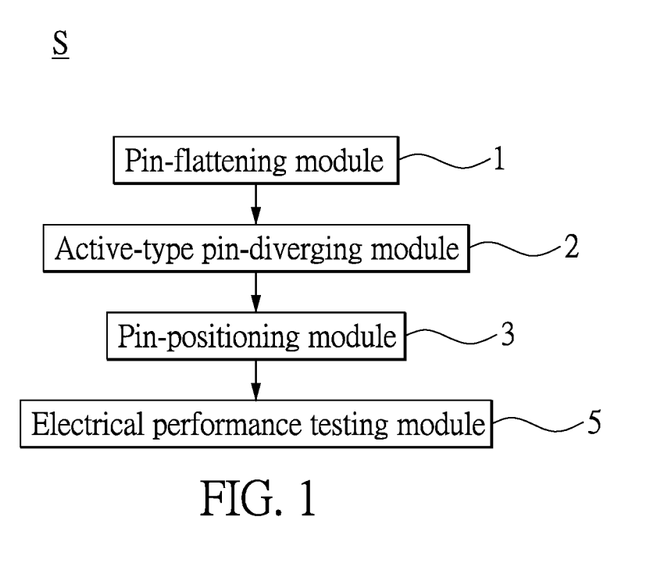
FIG. 1 shows a function block diagram of the capacitor detection system according to the first embodiment of the instant disclosure.
Figure 2:
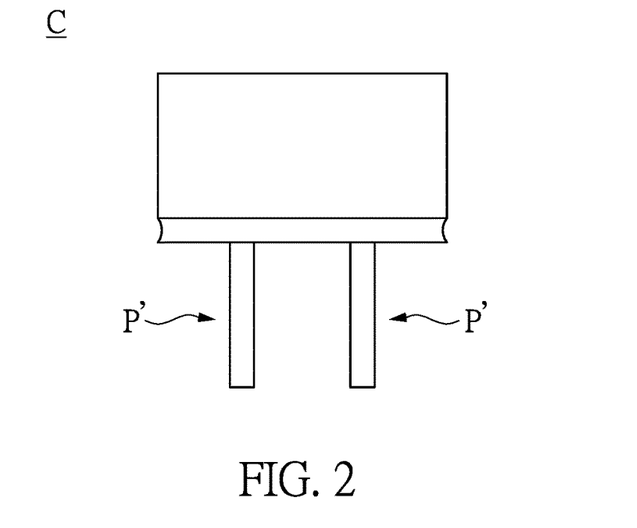
FIG. 2 shows a lateral, schematic view of the two conductive pins of the capacitor before being flattened according to the first embodiment of the instant disclosure.
Figure 3:
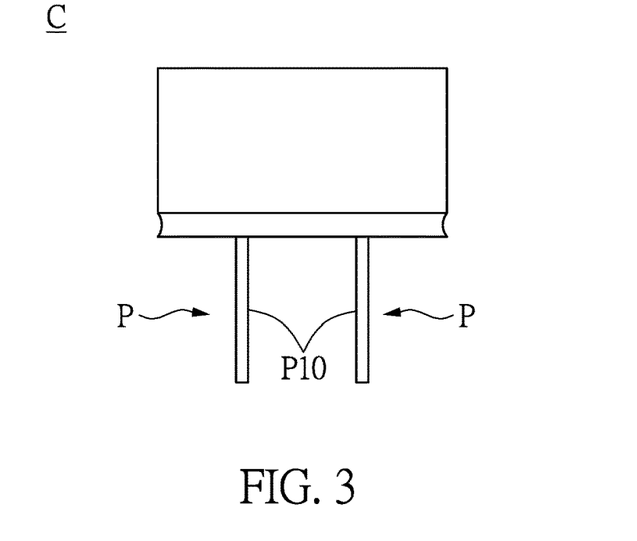
FIG. 3 shows a lateral, schematic view of the two conductive pins of the capacitor after having been flattened according to the first embodiment of the instant disclosure.

First, referring to FIG. 1 to FIG. 3, two cylindrical conductive pins P' of the capacitor C can be flattened by the pin-flattening module 1 to form two flat-shaped conductive pins P. For example, the capacitor C may be a winding solid electrolytic capacitor. FIG. 2 shows a lateral, schematic view before flattening of the two conductive pins P of the capacitor C according to the instant disclosure, and FIG. 3 shows a lateral, schematic view of the two conductive pins P of the capacitor C after having been flattened according to the instant disclosure. In other words, the two cylindrical conductive pins P' of the capacitor C can be flattened by the pin-flattening module 1, so that the shape of the conductive pin can be changed from cylindrical to flat. As shown in FIG. 3, after the cylindrical conductive pin P' of the capacitor C is flattened by the pin-flattening module 1 to form the flat-shaped conductive pin P, a flattened lateral contact surface P10 is formed on an inner side of the flat-shaped conductive pin P.

Moreover, referring to FIG. 1 and FIG. 4 to FIG. 6, the active-type pin-diverging module 2 is adjacent to the pin-flattening module 1 for diverging the two conductive pins P of the capacitor C, and the active-type pin-diverging module 2 includes a base structure 22 and a swingable structure 23. In addition, the swingable structure 23 is swingably disposed on the base structure 22, and the swingable structure 23 includes two swingable elements 230.

Therefore, referring to FIG. 6 and FIG. 7, the two conductive pins P of the capacitor C can respectively pass through two through holes B10 of a seat board B, and each conductive pin P has a lateral contact surface P10. The two swingable elements 230 of the swingable structure 23 can concurrently slidably contact the two lateral contact surfaces P10 of the two conductive pins P of the capacitor C so as to diverge the two conductive pins P of the capacitor C, so that the seat board B can be held by the two diverged conductive pins P so as to prevent the seat board B from being separated from the capacitor C. Please note that the friction resistance between the conductive pin P and the swingable element 230 can be decreased due to the sliding contact of a small contact area between the lateral contact surface P10 of the conductive pin P and the swingable element 230 of the swingable structure 23. More precisely, the friction resistance between the conductive pin P and the swingable element 230 is decreased, so that the reaction force applied to the two conductive pins P and the capacitor C due to the sliding contact of a small contact area between the lateral contact surface P10 and the swingable element 230 can be decreased (or the structural variation of a junction between the conductive pin P and the capacitor C can be decreased, and an outer force applied to an inner structure of the capacitor C can be decreased). Therefore, the capacitor C provided by the instant disclosure can avoid increasing leakage current (LC) and causing a short circuit.

Figure 4:
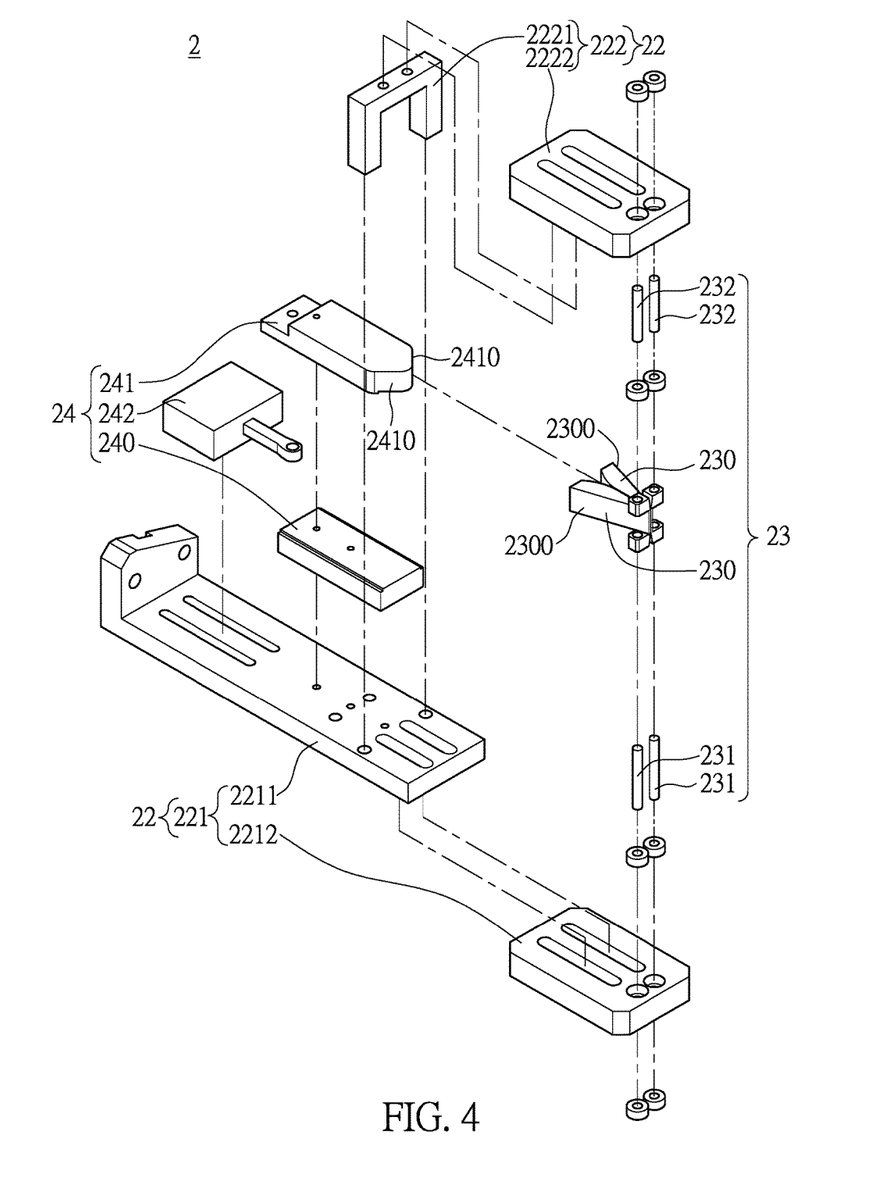
FIG. 4 shows a perspective, exploded, schematic view of the active-type pin-diverging module of the capacitor detection system according to the first embodiment of the instant disclosure.

For example, referring to FIG. 4 and FIG. 5, the base structure 22 includes a first base body 221 and a second base body 222 detachably connected to the first base body 221. In addition, the first base body 221 has a first base seat 2211 and a first pivot seat 2212 horizontally disposed on the first base seat 2211, the second base body 222 has a second base seat 2221 detachably connected to the first base seat 2211 and a second pivot seat 2222 vertically disposed on the second base seat 2221, and the swingable structure 23 is pivotably disposed between the first pivot seat 2212 and the second pivot seat 2222.

Following the above description, the swingable structure 23 further includes two first pivot axles 231 detachably connected to the first pivot seat 2212 and two second pivot axles 232 detachably connected to the second pivot seat 2222, one of the two swingable elements 230 is pivotably disposed between one of the two first pivot axles 231 and one of the two second pivot axles 232, and the other swingable element 230 is pivotably disposed between the other first pivot axle 231 and the other second pivot axle 232. Furthermore, the active-type pin-diverging module 2 further comprises a driving structure 24 including a fixed seat 240 detachably disposed on the first base seat 2211, a slidable element 241 slidably disposed on the fixed seat 240, and a driving element 242 disposed on the first base seat 2211 for moving the slidable element 241, and the slidable element 241 has two curved abutting surfaces 2410.

Referring to FIG. 6 and FIG. 7, please note that each swingable element 230 has an inclined surface 2300 and a curved surface 2301 opposite to the inclined surface 2300, the two inclined surfaces 2300 of the two swingable elements 230 are disposed back to back and respectively slidably contact the two lateral contact surfaces P10 of the two conductive pins P of the capacitor C (as shown in FIG. 7), and the two curved surfaces 2301 of the two swingable elements 230 are disposed face to face and respectively correspond to the two curved abutting surfaces 2410 of the slidable element 241 (as shown in FIG. 6). More particularly, as shown in FIG. 7, when the slidable element 241 is moved to concurrently abut against the two swingable elements 230 by the driving element 242, the two curved abutting surfaces 2410 of the slidable element 241 can be respectively abutted against the two curved surfaces 2301 of the two swingable elements 230. Then, the two inclined surfaces 2300 of the two swingable elements 230 can concurrently slidably contact the two lateral contact surfaces P10 of the two conductive pins P of the capacitor C for diverging the two conductive pins P so as to make the two conductive pins P incline toward a bottom side of the seat board B by a predetermined angle θ, so that the seat board B can be held by the two diverged conductive pins P so as to prevent the seat board B from being separated from the capacitor C. Therefore, the friction resistance between the conductive pin P and the swingable element 230 is decreased due to the sliding contact of a small contact area between the lateral contact surface P10 of the conductive pin P and the inclined surface 2300 of the swingable element 230. More precisely, the friction resistance between the conductive pin P and the swingable element 230 is decreased, so that the reaction force applied to the two conductive pins P and the capacitor C due to the sliding contact of a small contact area between the lateral contact surface P10 and the swingable element 230 can be decreased (or the structural variation of a junction between the conductive pin P and the capacitor C can be decreased, and an outer force applied to an inner structure of the capacitor C can be decreased). Therefore, the capacitor C provided by the instant disclosure can avoid increasing leakage current (LC) and causing a short circuit.

Figure 8:
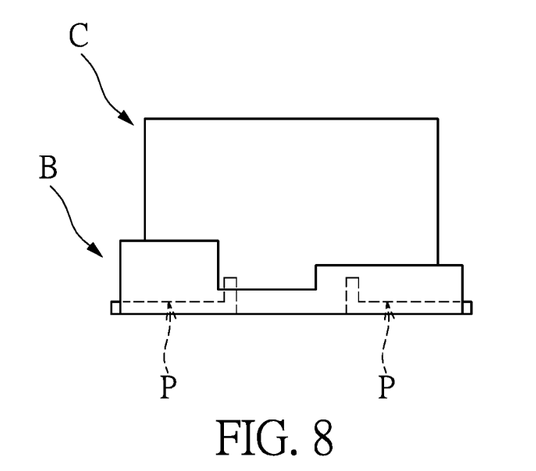
FIG. 8 shows a lateral, schematic view of the two conductive pins of the capacitor having been bent and positioned on the seat board according to the first embodiment of the instant disclosure.

Furthermore, referring to FIG. 1, FIG. 7, and FIG. 8, the pin-positioning module 3 is adjacent to the active-type pin-diverging module 2 for bending the two conductive pins P and positioning the two conductive pins P on the seat board B. For example, the two conductive pins P can be bent and positioned in two positioning grooves B11 of the seat board B. In addition, the electrical performance testing module 5 is adjacent to the pin-positioning module 3 for testing the electrical performance of the capacitor C. For example, the electrical performance testing module 5 can provide two testing pins (not shown) to electrically contact the two conductive pins P of the capacitor C so as to test the electrical performance of the capacitor C.

Second Embodiment

Figure 9:
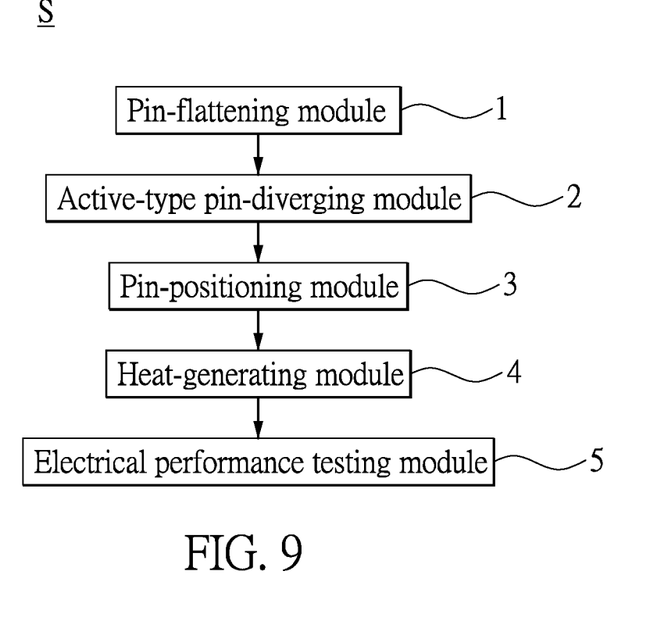
FIG. 9 shows a function block diagram of the capacitor detection system according to the second embodiment of the instant disclosure.

Referring to FIG. 9, the second embodiment of the instant disclosure provides a capacitor detection system S, comprising: a pin-flattening module 1, an active-type pin-diverging module 2, a pin-positioning module 3, and an electrical performance testing module 5. Comparing FIG. 9 and FIG. 1, the difference between the second embodiment and the first embodiment is as follows: in the second embodiment, the capacitor detection system S further comprises a heat-generating module 4 disposed between the pin-positioning module 3 and the electrical performance testing module 5, and the heat-generating module 4 can provide a predetermined heat source to the capacitor C so as to release stresses in the capacitor C. The stresses in the capacitor C are generated by the reaction force that is applied to the two conductive pins P and the capacitor C due to the sliding contact of a small contact area between the lateral contact surface P10 and the swingable element 230. For example, the heat-generating module 4 may be a hot air generator, an infrared generator, or an ultraviolet generator for generating the predetermined heat source.

In conclusion, the two swingable elements 230 of the swingable structure 23 can concurrently slidably contact the two lateral contact surfaces P10 of the two conductive pins P of the capacitor C so as to diverge the two conductive pins P of the capacitor C, so that the seat board B can be held by the two diverged conductive pins P so as to prevent the seat board B from being separated from the capacitor C. Please note that the friction resistance between the conductive pin P and the swingable element 230 can be decreased due to the sliding contact between the lateral contact surface P10 of the conductive pin P and the swingable element 230 of the swingable structure 23. More precisely, the friction resistance between the conductive pin P and the swingable element 230 is decreased, so that the reaction force applied to the two conductive pins P and the capacitor C due to the sliding contact between the lateral contact surface P10 and the swingable element 230 can be decreased (or the structural variation of a junction between the conductive pin P and the capacitor C can be decreased, and an outer force applied to an inner structure of the capacitor C can be decreased). Therefore, the capacitor C provided by the instant disclosure can avoid increasing leakage current (LC) and causing a short circuit.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. An active-type pin-diverging module applied to two conductive pins of a capacitor, comprising:
 a base structure; and
 a swingable structure swingably disposed on the base structure, wherein the swingable structure includes two swingable elements;
 wherein the two conductive pins of the capacitor respectively pass through two through holes of a seat board, each conductive pin has a lateral contact surface, the two swingable elements concurrently slidably contact the two lateral contact surfaces of the two conductive pins of the capacitor so as to diverge the two conductive pins of the capacitor, and the seat board is held by the two diverged conductive pins so as to prevent the seat board from being separated from the capacitor;
 wherein the friction resistance between the conductive pin and a corresponding one of the swingable elements is decreased due to the sliding contact between the lateral contact surface of the conductive pin and the corresponding swingable element of the swingable structure.

2. The active-type pin-diverging module of claim 1, wherein the base structure includes a first base body and a second base body detachably connected to the first base body, the first base body has a first base seat and a first pivot seat disposed on the first base seat, the second base body has a second base seat detachably connected to the first base seat and a second pivot seat disposed on the second base seat, and the two swingable elements of the swingable structure are pivotably disposed between the first pivot seat and the second pivot seat.

3. The active-type pin-diverging module of claim 2, wherein the swingable structure includes two first pivot axles detachably connected to the first pivot seat and two second pivot axles detachably connected to the second pivot seat, one of the two swingable elements is pivotably disposed between one of the two first pivot axles and one of the two second pivot axles, and the other swingable element is pivotably disposed between the other first pivot axle and the other second pivot axle.

4. The active-type pin-diverging module of claim 2, further comprising: a driving structure including a fixed seat detachably disposed on the first base seat, a slidable element slidably disposed on the fixed seat, and a driving element disposed on the first base seat for moving the slidable element, and the slidable element has two curved abutting surfaces, wherein each swingable element has an inclined surface and a curved surface opposite to the inclined surface, the two inclined surfaces of the two swingable elements are disposed back to back and respectively slidably contact the two lateral contact surfaces of the two conductive pins of the capacitor, and the two curved surfaces of the two swingable elements are disposed face to face and respectively correspond to the two curved abutting surfaces of the slidable element, wherein the friction resistance between the conductive pin and the swingable element is decreased due to the sliding contact between the lateral contact surface of the conductive pin and the inclined surface of the swingable element.

5. A capacitor detection system, comprising:
 a pin-flattening module for flattening two conductive pins of a capacitor;
 an active-type pin-diverging module adjacent to the pin-flattening module, the active-type pin-diverging module comprising:
 a base structure; and
 a swingable structure swingably disposed on the base structure, wherein the swingable structure includes two swingable elements, the two conductive pins of the capacitor respectively pass through two through holes of a seat board, each conductive pin has a lateral contact surface, the two swingable elements concurrently slidably contact the two lateral contact surfaces of the two conductive pins of the capacitor so as to diverge the two conductive pins of the capacitor, and the seat board is held by the two diverged conductive pins so as to prevent the seat board from being separated from the capacitor;
a pin-positioning module adjacent to the active-type pin-diverging module for bending the two conductive pins and positioning the two conductive pins on the seat board; and
an electrical performance testing module adjacent to the pin-positioning module for testing the electrical performance of the capacitor.

6. The capacitor detection system of claim 5, wherein the base structure includes a first base body and a second base body detachably connected to the first base body, the first base body has a first base seat and a first pivot seat disposed on the first base seat, the second base body has a second base seat detachably connected to the first base seat and a second pivot seat disposed on the second base seat, and the two swingable elements of the swingable structure are pivotably disposed between the first pivot seat and the second pivot seat.

7. The capacitor detection system of claim 6, wherein the swingable structure includes two first pivot axles detachably connected to the first pivot seat and two second pivot axles detachably connected to the second pivot seat, one of the two swingable elements is pivotably disposed between one of the two first pivot axles and one of the two second pivot axles, and the other swingable element is pivotably disposed between the other first pivot axle and the other second pivot axle.

8. The capacitor detection system of claim 6, wherein the active-type pin-diverging module further comprises a driving structure including a fixed seat detachably disposed on the first base seat, a slidable element slidably disposed on the fixed seat, and a driving element disposed on the first base seat for moving the slidable element, and the slidable element has two curved abutting surfaces, wherein each swingable element has an inclined surface and a curved surface opposite to the inclined surface, the two inclined surfaces of the two swingable elements are disposed back to back and respectively slidably contact the two lateral contact surfaces of the two conductive pins of the capacitor, and the two curved surfaces of the two swingable elements are disposed face to face and respectively correspond to the two curved abutting surfaces of the slidable element, wherein the friction resistance between the conductive pin and the swingable element is decreased due to the sliding contact between the lateral contact surface of the conductive pin and the inclined surface of the swingable element.

9. The capacitor detection system of claim 6, further comprising: a heat-generating module disposed between the pin-positioning module and the electrical performance testing module, wherein the heat-generating module provides a predetermined heat source to the capacitor so as to release stresses in the capacitor.

10. An active-type pin-diverging module, comprising:
a base structure; and
a swingable structure swingably disposed on the base structure, wherein the swingable structure includes two swingable elements;
wherein the two swingable elements of the swingable structure concurrently slidably contact two conductive pins of a capacitor so as to diverge the two conductive pins of the capacitor, and a seat board is held by the two diverged conductive pins so as to prevent the seat board from being separated from the capacitor; and
wherein the base structure includes a first base body and a second base body detachably connected to the first base body, the first base body has a first base seat and a first pivot seat disposed on the first base seat, the second base body has a second base seat detachably connected to the first base seat and a second pivot seat disposed on the second base seat, and the two swingable elements of the swingable structure are pivotably disposed between the first pivot seat and the second pivot seat.

* * * * *